(12) United States Patent
Lee et al.

(10) Patent No.: US 9,087,934 B2
(45) Date of Patent: Jul. 21, 2015

(54) SOLAR CELL AND METHOD FOR MANUFACTURING THE SAME

(75) Inventors: Daeyong Lee, Seoul (KR); Sangwook Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 328 days.

(21) Appl. No.: 13/472,109

(22) Filed: May 15, 2012

(65) Prior Publication Data

US 2013/0025665 A1  Jan. 31, 2013

(30) Foreign Application Priority Data

Jul. 25, 2011  (KR) .................. 10-2011-0073520

(51) Int. Cl.
  *H01L 31/0216* (2014.01)
  *H01L 31/0224* (2006.01)
  *H01L 31/068* (2012.01)
  *H01L 31/18* (2006.01)

(52) U.S. Cl.
  CPC .. *H01L 31/02168* (2013.01); *H01L 31/022433* (2013.01); *H01L 31/0684* (2013.01); *H01L 31/1868* (2013.01); *Y02E 10/547* (2013.01)

(58) Field of Classification Search
  CPC . H01L 33/0216; H01L 33/0224; H01L 33/18; H01L 33/02168; H01L 33/022433; H01L 33/0684; H01L 33/1868; Y02E 10/52; Y02E 10/547
  USPC .......... 136/244, 246, 250, 252, 256, 258, 262
  See application file for complete search history.

(56) References Cited

U.S. PATENT DOCUMENTS

| 4,828,628 | A | 5/1989 | Hezel et al. |
| 5,792,280 | A | 8/1998 | Ruby et al. |
| 5,928,438 | A | 7/1999 | Salami et al. |
| 2004/0112426 | A1 | 6/2004 | Hagino |
| 2011/0100459 | A1 | 5/2011 | Yoon et al. |
| 2011/0256377 | A1* | 10/2011 | Chiruvolu et al. ............ 428/220 |
| 2011/0265870 | A1* | 11/2011 | Park et al. ..................... 136/256 |
| 2012/0174960 | A1* | 7/2012 | Hashigami et al. ........... 136/244 |

FOREIGN PATENT DOCUMENTS

| EP | 2 077 584 A2 | 7/2009 |
| EP | 2 312 650 A2 | 4/2011 |
| EP | 2 339 648 A1 | 6/2011 |
| EP | 2 479 804 A1 | 7/2012 |
| JP | 5315628 A | 11/1993 |
| JP | 2004-193350 A | 7/2004 |
| KR | 10-2011-0059280 A | 6/2011 |
| WO | WO 2011/033826 A1 | 3/2011 |

* cited by examiner

*Primary Examiner* — Susan D Leong
(74) *Attorney, Agent, or Firm* — Birch, Stewart, Kolasch & Birch, LLP

(57) ABSTRACT

A solar cell and a method for manufacturing the same are discussed. The solar cell includes a substrate of a first conductive type, an emitter region of a second conductive type opposite the first conductive type positioned at the substrate, a first electrode which is positioned on the substrate and is connected to the emitter region, at least one second electrode which is positioned on the substrate and is connected to the substrate, and an aluminum oxide layer positioned on a front surface and a back surface of the substrate excluding areas of the substrate on which the first electrode and the at least one second electrode are formed.

17 Claims, 10 Drawing Sheets

SOLAR CELL AND METHOD FOR MANUFACTURING THE SAME

This application claims priority to and the benefit of Korean Patent Application No. 10-2011-0073520, filed in the Korean Intellectual Property Office on Jul. 25, 2011, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, carriers including electrons and holes are produced in the semiconductor parts. The carriers move to the n-type semiconductor part and the p-type semiconductor part under the influence of the p-n junction. Namely, the electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a substrate of a first conductive type, an emitter region of a second conductive type opposite the first conductive type, the emitter region being positioned at the substrate, a first electrode which is positioned on the substrate and is connected to the emitter region, at least one second electrode which is positioned on the substrate and is connected to the substrate, and an aluminum oxide layer positioned on a front surface and a back surface of the substrate excluding areas of the substrate on which the first electrode and the at least one second electrode are formed.

The aluminum oxide layer on the front surface of the substrate and the aluminum oxide layer on the back surface of the substrate may have the same thickness, the same refractive index, the same material, and the same composition.

The aluminum oxide layer may be additionally positioned on a lateral surface of the substrate.

The aluminum oxide layer on the front surface of the substrate, the aluminum oxide layer on the back surface of the substrate, and the aluminum oxide layer on the lateral surface of the substrate may have the same thickness, the same refractive index, the same material, and the same composition.

The solar cell may further include an anti-reflection layer positioned on the aluminum oxide layer on the front surface of the substrate.

The anti-reflection layer may be formed of silicon nitride.

A thickness of the anti-reflection layer may be greater than a thickness of the aluminum oxide layer.

The first conductive type of the substrate may be a p-type.

The solar cell may further include a capping layer positioned between the aluminum oxide layer on the back surface of the substrate and the at least one second electrode.

The capping layer may be formed of silicon nitride or silicon oxide.

The solar cell may further include a plurality of surface field regions which are locally positioned at the back surface of the substrate and are separated from one another. The at least one second electrode may be one second electrode including a plurality of contact portions abutting the plurality of surface field regions. The one second electrode may be connected to the substrate through the plurality of contact portions.

The aluminum oxide layer may have a thickness of about 10 nm to 30 nm.

The first electrode may be positioned on the front surface of the substrate, and the one second electrode may be positioned on the back surface of the substrate.

The solar cell may further include a capping layer positioned between the aluminum oxide layer on the back surface of the substrate and the at least one second electrode.

The capping layer may be formed of silicon nitride or silicon oxide.

When the capping layer is formed of silicon nitride, the capping layer may have a thickness of about 50 nm to 100 nm.

When the capping layer is formed of silicon oxide, the capping layer may have a thickness of about 70 nm to 150 nm.

The solar cell may further include a plurality of surface field regions which are locally positioned at the back surface of the substrate and are separated from one another. The at least one second electrode may include a plurality of contact portions abutting the plurality of surface field regions. The at least one second electrode may be connected to the substrate through the plurality of contact portions.

The solar cell may further include a plurality of surface field regions locally positioned at the back surface of the substrate. The first conductive type may be an n-type. The at least one second electrode may be a plurality of second electrodes positioned on the plurality of surface field regions.

The first electrode may be positioned on the front surface of the substrate, and the plurality of second electrodes may be positioned on the back surface of the substrate. Both the front surface and the back surface of the substrate may be incident surfaces on which light is incident.

In another aspect, there is a solar cell including a p-type semiconductor substrate, an emitter region positioned at a first surface of the semiconductor substrate, an aluminum oxide layer positioned directly on a second surface of the semiconductor substrate opposite the first surface, a passivation region positioned directly on the emitter region, an anti-reflection layer positioned on the passivation region, a first electrode which is positioned on the first surface of the semiconductor substrate and is connected to the emitter region, and a second electrode which is positioned on the second surface of the semiconductor substrate and is connected to the semiconductor substrate.

The passivation region may be formed of aluminum oxide.

The anti-reflection layer may be formed of silicon nitride or silicon oxide.

The aluminum oxide layer may be additionally positioned on a lateral surface of the semiconductor substrate.

In yet another aspect, there is a method for manufacturing a solar cell, the method including forming an emitter region of a second conductive type opposite a first conductive type at a first surface of a semiconductor substrate of the first conductive type, forming a first aluminum oxide layer directly on a second surface of the semiconductor substrate opposite the first surface using an atomic layer deposition (ALD) method, and forming a first electrode connected to the emitter region on the first surface of the semiconductor substrate and forming a second electrode connected to the semiconductor substrate on the second surface of the semiconductor substrate.

The forming of the first aluminum oxide layer may include forming the first aluminum oxide layer on a third surface of the semiconductor substrate different from the first and second surfaces.

The method may further include forming a second aluminum oxide layer on the emitter region.

The forming of the second aluminum oxide layer may be performed at the same time as the forming of the first aluminum oxide layer.

The method may further include forming a capping layer on the first aluminum oxide layer.

The capping layer may be formed of silicon nitride or silicon oxide.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
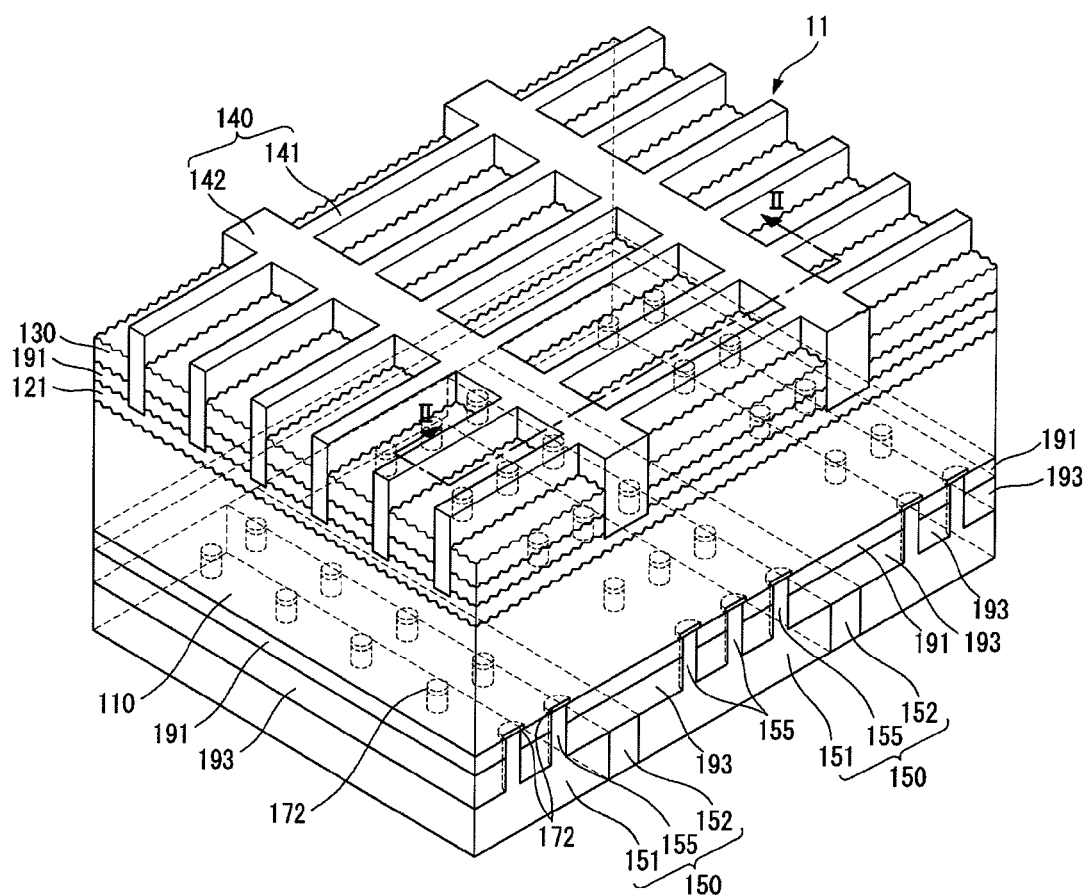
FIG. 1 is a partial perspective view of a solar cell according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Example embodiments of the invention will be described with reference to FIGS. 1 to 11.

A solar cell according to an example embodiment of the invention is described in detail with reference to FIGS. 1 to 3.

As shown in FIG. 1, a solar cell 11 according to an embodiment of the invention includes a substrate 110, an emitter region 121 positioned at an incident surface (hereinafter, referred to as "a front surface or a first surface") of the substrate 110 on which light is incident, a passivation region 191 which is positioned on the emitter region 121 (i.e., on the front surface of the substrate 110), a back surface (or a second surface) of the substrate 110 opposite the front surface, and a lateral surface (or a third surface) of the substrate 110, an anti-reflection layer 130 positioned on the passivation region 191 on the front surface of the substrate 110, a capping layer 193 positioned on the passivation region 191 on the back surface of the substrate 110, a front electrode part (or a first electrode part) 140 which is positioned on the front surface of the substrate 110 and is connected to the emitter region 121, a back electrode part (or a second electrode part) 150 which is positioned on the capping layer 193 and is connected to the substrate 110, and a plurality of surface field regions 172 selectively (or locally) positioned on the back surface of the substrate 110.

The substrate 110 is a semiconductor substrate formed of a semiconductor such as first conductive type silicon, for example, p-type silicon, though not required. The semiconductor used in the substrate 110 is a crystalline semiconductor, such as single crystal silicon or polycrystalline silicon.

When the substrate 110 is of the p-type, the substrate 110 is doped with impurities of a group III element such as boron (B), gallium (Ga), and indium (In). Alternatively, the substrate 110 may be of an n-type and/or may be formed of a semiconductor material other than silicon. If the substrate 110 is of the n-type, the substrate 110 may be doped with impurities of a group V element such as phosphorus (P), arsenic (As), and antimony (Sb).

Figure 2:
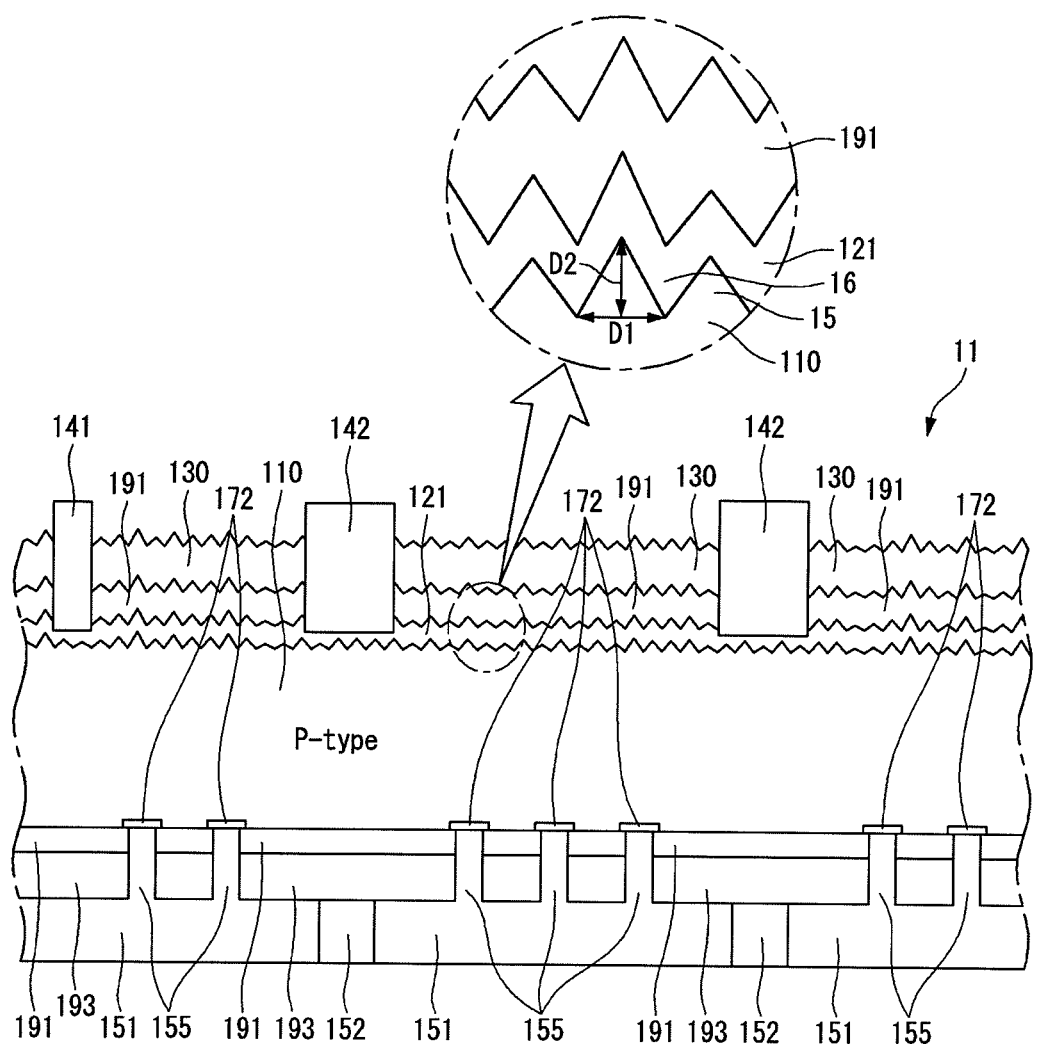
FIG. 2 is a cross-sectional view taken along line II-II of FIG. 1.

As shown in FIGS. 1 and 2, a separate texturing process may be performed on the flat front surface of the substrate 110 to form a textured surface corresponding to an uneven surface having a plurality of protrusions 15 and a plurality of depressions 16 or having uneven characteristics. In this instance, the emitter region 121, the passivation region 191, and the anti-reflection layer 130 positioned on the front surface of the substrate 110 have the textured surface.

As described above, because the front surface of the substrate 110 is textured, an incident area of the substrate 110 increases and a light reflectance decreases due to a plurality of reflection operations resulting from the textured surface. Hence, an amount of light incident on the substrate 110 increases, and the efficiency of the solar cell 11 is improved.

As shown in FIGS. 1 and 2, maximum diameters D1 and maximum heights D2 of the plurality of protrusions 15 of the textured surface of the substrate 110 are non-uniformly determined. Therefore, the plurality of protrusions 15 have the different maximum diameters D1 and the different maximum heights D2.

The emitter region 121 positioned at the front surface of the substrate 110 is an impurity doped region doped with impurities of a second conductive type (for example, n-type) opposite the first conductive type (for example, p-type) of the substrate 110. Thus, the emitter region 121 of the second conductive type forms a p-n junction along with a first conductive type region (for example, a p-type region) of the substrate 110.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the p-type and the emitter region 121 is of the n-type, the holes and the electrons move to the substrate 110 and the emitter region 121, respectively.

Because the emitter region 121 forms the p-n junction along with the first conductive type region of the substrate 110, the emitter region 121 may be of the p-type when the substrate 110 is of the n-type in another embodiment of the invention. In this instance, the electrons move to the substrate 110 and the holes move to the emitter region 121.

The passivation region 191 may be positioned on at least one of the front surface of the substrate 110 (i.e., the emitter region 121 positioned at the front surface of the substrate 110), the back surface of the substrate 110, and the lateral surface of the substrate 110. For example, the passivation region 191 shown in FIG. 3 is positioned on all of the front surface, the back surface, and the lateral surface of the substrate 110. In this instance, the passivation region 191 is positioned on at least one of four lateral surfaces of the substrate 110.

In the embodiment of the invention, the passivation region 191 on the front surface, the passivation region 191 on the back surface, and the passivation region 191 on the lateral surface of the substrate 110 have the same characteristics. Thus, the passivation region 191 on the front surface, the passivation region 191 on the back surface, and the passivation region 191 on the lateral surface of the substrate 110 have the same thickness, the same properties, the same material, the same composition, the same refractive index, etc. Alternatively, the passivation regions 191 on the front surface, the back surface, and the lateral surface of the substrate 110 have the same properties, the same material, the same composition, the same refractive index, but at least one of the passivation regions 191 may have a different thickness, for example, if necessary or desired.

In the embodiment of the invention, the passivation region 191 may be formed of aluminum oxide (AlxOy), for example, $Al_2O_3$, and may have a thickness of about 10 nm to 30 nm. In this instance, the passivation region 191 may have a refractive index of about 1.4 to 1.6.

The passivation region 191 performs a passivation function which converts a defect, for example, dangling bonds existing at and around the surface of the substrate 110 into stable bonds to thereby prevent or reduce a recombination and/or a disappearance of carriers moving to the surface of the substrate 110. Thus, the passivation region 191 reduces an amount of carriers lost by the defect at the surface of the substrate 110.

In the embodiment of the invention, because the passivation region 191 is positioned on all of the front surface, the back surface, and the lateral surface of the substrate 110, the passivation function of the passivation region 191 is further improved by an increase in a formation area of the passivation region 191. For example, because the most of the defect generally exists at and around the surface of the substrate 110, the defect mostly exists at and around the front surface, the back surface, and the lateral surface of the substrate 110 to thereby lead to a loss of carriers produced in the substrate 110.

Further, when the emitter region 121 is formed at the substrate 110 using, for example, a thermal oxidation method, the emitter region 121 is formed at both the front surface and the back surface of the substrate 110. When the back surface of the substrate 110 is immersed in an etchant, etc., so as to remove the emitter region 121 formed at the back surface of the substrate 110, the etchant penetrates into the lateral surface as well as the back surface of the substrate 110. Hence, a damage layer having many defects is generated in the lateral surface of the substrate 110, thereby resulting in an increase in a loss amount of carriers at and around the lateral surface of the substrate 110.

On the other hand, in the embodiment of the invention, because the passivation region 191 is positioned on the lateral surface as well as the front and back surfaces of the substrate 110, the defect leading to the loss of carriers is removed. As a result, the efficiency of the solar cell 11 is further improved.

In the embodiment of the invention, when the thickness of the passivation region 191 is equal to or greater than about 10 nm, the passivation region 191 is more uniformly formed on the substrate 110 and more stably performs the passivation function. When the thickness of the passivation region 191 is equal to or less than about 30 nm, the passivation region 191 stably performs the passivation function without the unnecessary increase in the thickness of the passivation region 191. Hence, the manufacturing cost and time may be reduced.

The anti-reflection layer 130 positioned on the front surface of the substrate 110 reduces a reflectance of light incident on the solar cell 11 and increases selectivity of a predetermined wavelength band, thereby increasing the efficiency of the solar cell 11.

The anti-reflection layer 130 may be formed of hydrogenated silicon nitride (SiNx:H). The anti-reflection layer 130 has a thickness greater than the passivation region 191. For example, the anti-reflection layer 130 may have the thickness of about 70 nm to 100 nm and a refractive index of about 2.0 to 2.2. For example, the anti-reflection layer 130 is 3 to 7 times thicker than the passivation layer 191.

When the refractive index of the anti-reflection layer 130 is equal to or greater than about 2.0, the reflectance of light decreases and an amount of light absorbed in the anti-reflection layer 130 further decreases. Further, when the refractive index of the anti-reflection layer 130 is equal to or less than about 2.2, the reflectance of the anti-reflection layer 130 further decreases.

When the thickness of the anti-reflection layer 130 is equal to or greater than about 70 nm, an anti-reflection effect of light is more efficiently obtained. When the thickness of the anti-reflection layer 130 is equal to or less than about 100 nm, an amount of light absorbed in the anti-reflection layer 130 decreases and an amount of light incident on the substrate 110 increases. Further, in the process for manufacturing the solar cell 11, the front electrode part 140 easily and smoothly passes through the anti-reflection layer 130 and is stably and smoothly connected to the emitter region 121.

The anti-reflection layer 130 performs the passivation function at and around the surface of the substrate 110 using hydrogen (H) contained in the anti-reflection layer 130. Thus, the anti-reflection layer 130 serves as a passivation part at the front surface of the substrate 110 in the same manner as the passivation region 191.

As described above, because the passivation function is additionally performed by the anti-reflection layer 130 as well as the passivation region 191, the passivation effect of the solar cell 11 is greatly improved. Hence, the efficiency of the solar cell 11 is further improved.

Further, the passivation region 191 positioned on the front surface of the substrate 110 performs an anti-reflection function of light along with the anti-reflection layer 130 using its refractive index and thickness. Thus, the passivation region 191 positioned on the front surface of the substrate 110 serves as an anti-reflection part in the same manner as the anti-reflection layer 130.

The anti-reflection layer 130 shown in FIGS. 1 and 2 has a single-layered structure, but may have a multi-layered structure, for example, a double-layered structure. Further, the anti-reflection layer 130 may be omitted, if necessary or desired.

The front electrode part 140 includes a plurality of front electrodes (or a plurality of first electrodes) 141 positioned on the front surface of the substrate 110 and a plurality of front bus bars (or a plurality of first bus bars) 142 which are positioned on the front surface of the substrate 110 and are connected to the plurality of front electrodes 141.

The plurality of front electrodes 141 are connected to the emitter region 121 and are separated from one another. The plurality of front electrodes 141 extend parallel to one another in a fixed direction. The plurality of front electrodes 141 collect carriers (for example, electrons) moving to the emitter region 121.

The plurality of front bus bars 142 are connected to the emitter region 121 and extend parallel to one another in a direction crossing the front electrodes 141.

In this instance, the front bus bars 142 are positioned at the same layer level as the front electrodes 141 and are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a longitudinal (or transverse) direction. Hence, the front electrode part 140 has a lattice shape on the front surface of the substrate 110.

The front bus bars 142 collect not only carriers (for example, electrons) moving from the emitter region 121 but also carriers collected by the front electrodes 141 crossing the front bus bars 142, and move the collected carriers in a desired direction. Thus, a width of each front bus bar 142 is greater than a width of each front electrode 141.

The front bus bars 142 are connected to an external device and output the collected carriers to the external device.

The front electrode part 140 including the front electrodes 141 and the front bus bars 142 is formed of at least one conductive material such as silver (Ag).

In the embodiment of the invention, the number of front electrodes 141 and the number of front bus bars 142 may vary, if necessary or desired.

As described above, the passivation region 191 positioned on the back surface of the substrate 110 reduces an amount of carriers lost by the defect at and around the back surface of the substrate 110.

Further, the passivation region 191 positioned on the back surface of the substrate 110 reflects light passing through the substrate 110 back to the substrate 110 and increases an amount of light incident on the substrate 110. A light reflection operation of the passivation region 191 may be carried out by a relation between metal (for example, aluminum (Al)) contained in the passivation region 191 and the refractive index of the passivation region 191.

In general, aluminum oxide (AlxOy) has the characteristic of negative fixed charges.

In the embodiment of the invention, the substrate 110 is of the p-type, and the passivation region 191, which is formed directly on the back surface of the substrate 110 using aluminum oxide (AlxOy), has the characteristic of negative fixed charges. Hence, positive charges (i.e., holes) moving to the passivation region 191 have a polarity opposite the passivation region 191 formed of aluminum oxide (AlxOy). As a result, the holes are drawn to the passivation region 191 because of the polarity of the passivation region 191. On the other hand, negative charges (i.e., electrons) have the same polarity as the passivation region 191 formed of aluminum oxide (AlxOy) and thus are pushed out of the passivation region 191 because of the polarity of the passivation region 191. Hence, when the passivation region 191 is formed on the p-type substrate 110 using aluminum oxide (AlxOy), an amount of carriers moving to the back surface of the substrate 110 further increases because of the influence of negative fixed charges.

Accordingly, when the passivation region 191 having the characteristic of negative fixed charges is positioned on the n-type emitter region 121, the passivation region 191 adversely affects the movement of electrons to the n-type emitter region 121 because of the above-described reason. However, because the anti-reflection layer 130 formed of silicon nitride (SiNx) having the characteristic of positive fixed charges has the thickness greater than the passivation region 191, the anti-reflection layer 130 stably prevents the adverse influence of negative fixed charges of the passivation region 191. As a result, even if the passivation region 191 having the negative fixed charges is positioned directly on the n-type emitter region 121, the anti-reflection layer 130 makes it possible for electrons to stably move to the emitter region 121.

The passivation region 191 may be formed using various layer formation methods such as a plasma enhanced chemical vapor deposition (PECVD) method and an atomic layer deposition (ALD) method.

When the passivation region 191 is formed using the ALD method, the passivation regions 191 having the same characteristic (i.e., the same thickness, properties, material, composition, refractive index) may be formed on the front surface, the back surface, and the lateral surface of the substrate 110 through one process. In this instance, manufacturing time of the passivation region 191 is reduced.

Alternatively, when the passivation region 191 is formed using the PECVD method, the passivation regions 191 may be individually formed on the front surface, the back surface, and the lateral surface of the substrate 110. Thus, because the passivation region 191 having the proper thickness may be formed on each of the front surface, the back surface, and the lateral surface of the substrate 110, at least one of the passivation regions 191 formed on the front surface, the back surface, and the lateral surface of the substrate 110 may have the thickness different from the other passivation regions 191. In this instance, because the thickness of the passivation region 191 may be controlled depending on a function of each location of the substrate 110, the effect of the passivation regions 191 is further improved. Even if the passivation region 191 is formed using the ALD method, the passivation region 191 may be formed only on one desired surface of the front surface, the back surface, and the lateral surface of the substrate 110.

The capping layer 193 positioned on the passivation region 191 positioned on the back surface of the substrate 110 is formed of hydrogenated silicon oxide (SiOx:H) and/or hydrogenated silicon nitride (SiNx:H).

When the capping layer 193 is formed of hydrogenated silicon oxide (SiOx:H), the capping layer 193 may have a thickness of about 70 nm to 150 nm and a refractive index of about 1.4 to 1.6.

Alternatively, when the capping layer 193 is formed of hydrogenated silicon nitride (SiNx:H), the thickness of the capping layer 193 formed of hydrogenated silicon nitride (SiNx:H) may be less than the thickness of the capping layer 193 formed of hydrogenated silicon oxide (SiOx:H) because hydrogenated silicon nitride (SiNx:H) has reactivity less than hydrogenated silicon oxide (SiOx:H). For example, the capping layer 193 formed of hydrogenated silicon nitride (SiNx:H) may have a thickness of about 50 nm to 100 nm and a refractive index of about 2.0 to 2.2.

In general, silicon oxide (SiOx) and silicon nitride (SiNx) have the characteristic of positive fixed charges.

Accordingly, when the capping layer 193 is formed of silicon oxide (SiOx) and/or silicon nitride (SiNx) and the substrate 110 is of the p-type, the movement of carriers (i.e., holes) to the back surface of the substrate 110 may be adversely affected by the capping layer 193. However, in the embodiment of the invention, the passivation region 191 between the substrate 110 and the capping layer 193 prevents the adverse influence of the positive fixed charges of the capping layer 193 on the substrate 110. Hence, holes from the substrate 110 stably move to the back electrode part 150.

The capping layer 193 performs the passivation function using hydrogen (H) contained in the capping layer 193. Further, the capping layer 193 prevents aluminum (Al), which is contained in the passivation region 191 and performs the passivation function, from moving to the front surface opposite the back surface of the substrate 110, thereby further improving the passivation function of the passivation region 191.

Thus, the back surface of the substrate 110 has a double passivation structure including the passivation region 191, which is positioned directly on the back surface of the substrate 110 and is formed of aluminum oxide (AlxOy), and the capping layer 193, which is positioned on the passivation region 191 and is formed of silicon oxide (SiOx) and/or silicon nitride (SiNx).

The passivation region 191 is a first passivation layer corresponding to a lower layer of the double passivation structure, and the capping layer 193 is a second passivation layer corresponding to an upper layer of the double passivation structure. In another embodiment of the invention, the capping layer 193 may be omitted.

Each of the plurality of surface field regions 172 locally or selectively positioned at the back surface of the substrate 110 is a region (for example, a p$^+$-type region) that is more heavily doped than the substrate 110 with impurities of the same conductive type as the substrate 110. Thus, each surface field region 172 has a sheet resistance less than the substrate 110 and has conductivity greater than the substrate 110.

As shown in FIG. 1, because the plurality of surface field regions 172 are locally or selectively positioned at the back surface of the substrate 110, a portion not including the surface field regions 172 exists at an edge of the back surface of the substrate 110 and in the middle of the back surface of the substrate 110.

A potential barrier is formed by a difference between impurity concentrations of a first conductive region (for example, a p-type region) of the substrate 110 and the surface field regions 172. Hence, the potential barrier prevents or reduces electrons from moving to the surface field regions 172 used as a moving path of holes and makes it easier for holes to move to the surface field regions 172. Thus, the surface field regions 172 reduce an amount of carriers lost by a recombination and/or a disappearance of the electrons and the holes at and around the back surface of the substrate 110 and accelerate a movement of desired carriers (for example, holes), thereby increasing an amount of carriers moving to the back electrode part 150.

The back electrode part 150 is positioned on the capping layer 193 and includes a back electrode (or a second electrode) 151 and a plurality of back bus bars (or a plurality of second bus bars) 152 connected to the back electrode 151.

The back electrode 151 is positioned on the capping layer 193 except a formation area of the plurality of back bus bars 152. Alternatively, the back electrode 151 may be not positioned on a portion of the capping layer 193, on which the plurality of back bus bars 152 are formed, and at an edge of the back surface of the substrate 110.

The back electrode 151 includes a plurality of contact portions 155, which sequentially pass through the capping layer 193 and the passivation region 191 and are connected to the plurality of surface field regions 172. Hence, the back electrode 151 is selectively or locally connected to a portion (i.e., the plurality of surface field regions 172) of the substrate 110 through the plurality of contact portions 155.

Accordingly, as shown in FIGS. 1 and 2, because the surface field regions 172 are positioned at and around the back surface of the substrate 110 abutting the contact portions 155, the surface field region 172 is not positioned at the back surface of the substrate 110 between the adjacent contact portions 155.

As shown in FIG. 1, the plurality of contact portions 155 are spaced apart from one another at a predetermined distance (for example, about 0.5 mm to 1 mm) therebetween and are connected to the substrate 110. Each contact portion 155 has various cross-sectional shapes such as a circle, an oval, and a polygon.

In the embodiment of the invention, the cross-sectional shape of the contact portion 155 is the cross-sectional shape obtained by cutting the contact portion 155 parallel to the flat front surface or the flat back surface of the substrate 110.

Alternatively, each contact portion 155 may have a stripe shape elongating in one direction in the same manner as the front electrode 141 and may be electrically connected to the substrate 110. In this instance, the number of contact portions 155 having the stripe shape is much less than the number of contact portions 155 having the circle, the oval, or the polygon.

The contact portions 155 collect carriers (for example, holes) moving from the substrate 110 and transfer the carriers to the back electrode 151.

Because the surface field regions 172, which have the conductivity greater than the substrate 110 due to the impurity concentration higher than the substrate 110, abut the contact portions 155, the mobility of carriers from the substrate 110 to the contact portions 155 is improved.

The back electrode 151 may contain a conductive material (for example, aluminum (Al)) different from the front electrode part 140. Alternatively, the back electrode 151 may contain the same conductive material as the front electrode part 140.

The contact portions 155 contacting the substrate 110 may contain only the material of the back electrode 151 or may contain a mixture of the materials of the capping layer 193, the passivation region 191, and the substrate 110 as well as the material of the back electrode 151.

More specifically, before the formation of the back electrode 151, a plurality of openings exposing the back surface of the substrate 110 are formed at a corresponding location of the capping layer 193 and the passivation region 191 underlying the capping layer 193. Then, the back electrode 151 is formed on the capping layer 193 and on the back surface of the substrate 110 exposed through the plurality of openings. Because the back electrode 151 positioned inside the plurality of openings is formed as the contact portions 155, the surface field regions 172 positioned at the back surface of the substrate 110 are electrically connected to the back electrode 151. In this instance, the contact portions 155 contain only the material of the back electrode 151.

Alternatively, a back electrode paste containing a metal material for the back electrode 151 is coated on the capping layer 193 and then is dried without a separate process for forming the openings. Then, a laser beam is applied to a corresponding location of the dried back electrode paste to selectively (or locally) apply heat to the back electrode paste. Hence, a portion of the back electrode paste, to which the heat is applied, is mixed with the materials of the capping layer 193 and the passivation region 191 underlying the portion of the back electrode paste and is electrically connected to the back surface of the substrate 110. The portion of the back electrode paste, to which the heat is applied, serves as the contact portions 155, and the materials of the back electrode 151, the capping layer 193, the passivation region 191, and the substrate 110 are mixed with one another in each contact portion 155.

When the plurality of openings are formed in the capping layer 193 and the passivation region 191 and then the back electrode 151 is formed, the electrical connection between the back surface of the substrate 110 and the back electrode 151 is more stably carried out. On the other hand, when the heat is selectively (or locally) applied to the back electrode paste and then the back electrode 151 selectively (or locally) connected to the substrate 110 is formed, the thermal process for forming the plurality of openings in the capping layer 193 and the passivation region 191 is not necessary. Therefore, the manufacturing time of the solar cell 11 is reduced.

If the back electrode 151 is positioned directly on the passivation region 191 and contacts the passivation region 191, the material (for example, the back electrode paste containing aluminum) of the back electrode 151 may chemically react with the passivation region 191 formed of aluminum oxide in the thermal process for forming the back electrode 151. Hence, the passivation region 191 may be electrically connected to the back electrode 151. As a result, a loss of carriers moving to the back electrode 151 may be generated.

However, when the capping layer 193 is formed between the passivation region 191 and the back electrode 151, the capping layer 193 prevents the chemical reaction between the formation material of the back electrode 151 and the passivation region 191. Hence, the electrical connection between the passivation region 191 and the back electrode 151 is prevented more stably. As a result, when carriers move from the substrate 110 to the back electrode 151, a loss of carriers resulting from the electrical connection between the passivation region 191 and the back electrode 151 is prevented or reduced.

When the thickness of the capping layer 193 formed of silicon oxide (SiOx) and/or silicon nitride (SiNx) is equal to or greater than about 70 nm, the capping layer 193 stably prevents the reaction between the back electrode part 150 and the passivation region 191. Hence, the capping layer 193 makes it possible for the back electrode part 150 to stably operate.

Further, when the thickness of the capping layer 193 formed of silicon oxide (SiOx) and/or silicon nitride (SiNx) is equal to or less than about 150 nm, the capping layer 193 stably prevents the reaction between the back electrode part 150 and the passivation region 191 while preventing an unnecessary increase in its thickness.

Alternatively, if the substrate 110 is of the n-type, the emitter region 121 is of the p-type, and each surface field region 172 is of the n-type, the back electrode 151 may be formed using a paste containing silver (Ag).

In this instance, when a paste (for example, a silver paste) for the back electrode 151 is coated directly on the passivation region 191, and then the thermal process is performed on the back electrode paste to form the back electrode 151, the passivation region 191 formed of aluminum oxide does not react with the back electrode 151 formed of the silver paste in the thermal process. Therefore, the capping layer 193 may be omitted. Further, when the substrate 110 is of the p-type and the emitter region 121 is of the n-type, the capping layer 193 may be omitted if the back electrode part 150 is formed of a material which does not react with the passivation region 191. As described above, if the capping layer 193 is omitted, the manufacturing cost and the manufacturing time of the solar cell 11 may be reduced.

The back bus bars 152 connected to the back electrode 151 are positioned on the capping layer 193, on which the back electrode 151 is not positioned. The back bus bars 152 extend in the same direction as the front bus bars 142 and have a stripe shape. The back bus bars 152 and the front bus bars 142 are positioned opposite to each other with the substrate 110 between them.

The back bus bars 152 collect carriers transferred from the back electrode 151, similar to the front bus bars 142. Thus, the back bus bars 152 may be formed of a material with conductivity greater than the back electrode 151. For example, the back bus bars 152 contain at least one conductive material such as silver (Ag).

The back bus bars 152 are connected to the external device and output the collected carriers (for example, holes) to the external device.

Unlike the configuration illustrated in FIG. 1, the back bus bars 152 may partially overlap the back electrode 151 in another embodiment. In this instance, a contact resistance between the back electrode 151 and the back bus bars 152 may decrease by an increase in a contact area between the back electrode 151 and the back bus bars 152. Hence, an amount of carriers transferred from the back electrode 151 to the back bus bars 152 may increase.

Further, the back electrode 151 may be positioned on the capping layer 193 on which the back bus bars 152 are formed. In this instance, the back bus bars 152 may be positioned on the back electrode 151 to be opposite to the front bus bars 142 with the substrate 110 between them. Thus, because the back electrode 151 may be positioned on the capping layer 193 irrespective of the formation location of the back bus bars 152, the back electrode 151 may be more easily formed.

In an alternative example, each of the back bus bars 152 may include a plurality of conductors, each of which may have a circle, an oval, or a polygon shape instead of the stripe shape, and are disposed at a uniform or non-uniform distance therebetween along an extension direction of the front bus bars 142. In this instance, because, the use of an expensive material, for example, silver (Ag) for the back bus bars 152 decreases, the manufacturing cost of the solar cell 11 is reduced.

The number of back bus bars 152 shown in FIG. 1 may vary, if necessary or desired.

An operation of the solar cell 11 having the above-described structure is described below.

When light irradiated to the solar cell 11 is incident on the substrate 110, which is the semiconductor part, through the anti-reflection layer 130, the passivation region 191, and the emitter region 121, electrons and holes are generated in the substrate 110 by light energy produced based on the incident light. In this instance, because a reflection loss of the light incident on the substrate 110 is reduced by the anti-reflection layer 130 and the textured surfaces, an amount of light incident on the substrate 110 increases.

The electrons move to the n-type emitter region 121 and the holes move to the p-type substrate 110 by the p-n junction of the substrate 110 and the emitter region 121. The electrons moving to the emitter region 121 are collected by the front electrodes 141 and the front bus bars 142 and then are transferred to the front bus bars 142. The holes moving to the substrate 110 are transferred to the contact portions 155 and then are collected by the back bus bars 152 via the back electrode 151. When the front bus bars 142 are connected to the back bus bars 152 using electric wires, current flows therein to thereby enable use of the current for electric power.

The passivation region 191 formed of aluminum oxide is positioned on the entire surface of the substrate 110 except the formation area of the front electrode part 140 and the formation area of the back electrode part 150. Thus, the passivation region 191 is positioned on the lateral surface as well as the front and back surfaces of the substrate 110. An increase in the formation area of the passivation region 191 results in a large reduction in an amount of carriers lost by the defect.

Because the passivation region 191 having the refractive index between a refractive index of air and a refractive index of the substrate 110 is positioned on the lateral surface of the substrate 110, an amount of light incident on the lateral surface of the substrate 110 increases. Hence, the efficiency of the solar cell 11 is improved.

More specifically, when the plurality of solar cells 11 are arranged in a matrix form and are connected in series or parallel to one another to form a solar cell module, light is incident on the lateral surface as well as the front surface of the substrate 11 because of an incident angle or several reflection operations of the light incident on the solar cells 11 or the solar cell module.

Accordingly, a difference between the refractive indexes of the passivation region 191 and the substrate 110 when the passivation region 191 is positioned on the lateral surface of the substrate 110 is less than a difference between the refractive indexes of air and the substrate 110 when the passivation region 191 is not positioned on the lateral surface of the substrate 110.

In other words, when the passivation region 191 is not positioned on the lateral surface of the substrate 110, light is incident from air (having the refractive index of about 1) to the substrate 110 (having the refractive index of about 3.1). On the other hand, when the passivation region 191 is positioned on the lateral surface of the substrate 110, the light is incident from air (having the refractive index of about 1) to the substrate 110 (having the refractive index of about 3.1) via the passivation region 191 (having the refractive index of about 1.6). Thus, a refractive index going from air to the substrate 110 gradually increases.

An amount of change of the refractive index from air to the substrate 110 when the passivation region 191 is positioned on the lateral surface of the substrate 110 is less than an amount of change of the refractive index from air to the substrate 110 when the passivation region 191 is not positioned on the lateral surface of the substrate 110. Therefore, an amount of light incident on the substrate 110 when light is incident from air to the substrate 110 via the passivation region 191 is greater than an amount of light incident on the substrate 110 when light is incident from air to the substrate 110.

As described above, because the passivation region 191 is positioned on the lateral surface of the substrate 110, a loss amount of carriers decreases, and an amount of light incident on the substrate 110 increases. Hence, the efficiency of the solar cell 11 is improved.

A method for manufacturing the solar cell 11 is described below.

First, the emitter region 121 of the second conductive type (for example, n-type) is formed inside the front surface of the crystalline semiconductor substrate 110 of the first conductive type (for example, p-type) using a thermal diffusion method or an ion implantation method.

Next, a layer (i.e., the passivation region 191) formed of aluminum oxide is formed on at least one of the back surface, the lateral surface, and the front surface (i.e., the emitter region 121) of the substrate 110 using a layer deposition method such as the ALD method and the PECVD method. In this instance, the passivation region 191 may be formed on the back surface and the lateral surface of the substrate 110 and on the emitter region 121 using a separate layer deposition method. The passivation region 191 may be simultaneously formed on the back surface and the lateral surface of the substrate 110 and on the emitter region 121 through one layer deposition process using the ALD method. When the passivation region 191 is simultaneously formed on the back surface and the lateral surface of the substrate 110 and on the emitter region 121, the passivation regions 191 on the back surface and the lateral surface of the substrate 110 and on the emitter region 121 may have the same thickness, properties, material, composition, refractive index, etc.

Next, the anti-reflection layer 130 is formed on the passivation region 191 positioned on the front surface of the substrate 110 using the PECVD method. Further, the capping layer 193 is formed on the passivation region 191 positioned on the back surface of the substrate 110 using the PECVD method. In this instance, the capping layer 193 may be formed of silicon oxide and/or silicon nitride.

In the embodiment of the invention, a formation order of the anti-reflection layer 130 and the capping layer 193 may vary.

Next, a front electrode part paste or a front electrode part ink is coated on the anti-reflection layer 130 using a screen printing method or an inkjet printing method and then dried to form a front electrode part pattern. Further, a back electrode paste or a back electrode ink and a back electrode bar paste or a back electrode bar ink are coated on the capping layer 193 using the screen printing method or the inkjet printing method and then are dried to form a back electrode pattern and a back bus bar pattern. In the embodiment of the invention, a formation order of the front electrode part pattern, the back electrode pattern, and the back bus bar pattern may vary.

Next, heat is locally or selectively applied to a back electrode part pattern including the back electrode pattern and the back bus bar pattern using a laser beam, etc., to form the plurality of surface field regions 172 at the back surface of the substrate 110.

Next, the thermal process is performed on the substrate 110 including the front electrode part pattern, the back electrode pattern, and the back bus bar pattern to form the front electrode part 140, which passes through the anti-reflection layer 130 and the passivation region 191 underlying the anti-reflection layer 130 and thus is physically and chemically connected to the emitter region 121, using the front electrode part pattern, to form the back electrode 151, which has the plurality of contact portions 155 physically and chemically connected to the surface field regions 172 and is electrically connected to the substrate 110, and the back bus bars 152 connected to the back electrode 151 respectively using the back electrode pattern and the back bus bar pattern. A portion of the back electrode pattern, to which the laser beam is applied, is formed as the plurality of contact portions 155. Each of the plurality of contact portions 155 may contain a mixture of the materials of the capping layer 193, the passivation region 191, and the substrate 110 as well as the material of the back electrode 151.

In another embodiment, before the back electrode pattern is formed on the capping layer 193, a portion of the capping layer 193 and a portion of the passivation region 191 underlying the capping layer 193 are removed using an etching paste, etc., to form a plurality of openings exposing a portion of the back surface of the substrate 110 in the capping layer 193 and the passivation region 191.

Next, the back electrode pattern is coated on the capping layer 193 and on the back surface of the substrate 110 exposed through the plurality of openings.

Next, as described above, the thermal process is performed on the substrate 110 including the front electrode part pattern, the back electrode pattern, and the back bus bar pattern to form the front electrode part 140 connected to the emitter region 121, the plurality of surface field regions 172 which are positioned at the back surface of the substrate 110 exposed through the openings by injecting a portion of the material contained in the back electrode pattern into the substrate 110, the back electrode 151, which has the plurality of contact portions 155 physically and chemically connected to the surface field regions 172 and is electrically connected to the substrate 110, and the back bus bars 152 connected to the back electrode 151.

In this instance, the back electrode pattern positioned in the plurality of openings is formed as the plurality of contact portions 155. Thus, each of the plurality of contact portions 155 may contain only the material of the back electrode 151.

A solar cell 12 according to another example embodiment of the invention is described below with reference to FIGS. 4 to 6.

Structures and components identical or equivalent to those described in the solar cells 11 and 12 according to the embodiments of the invention are designated with the same reference numerals, and a further description may be briefly made or may be entirely omitted.

Figure 3:
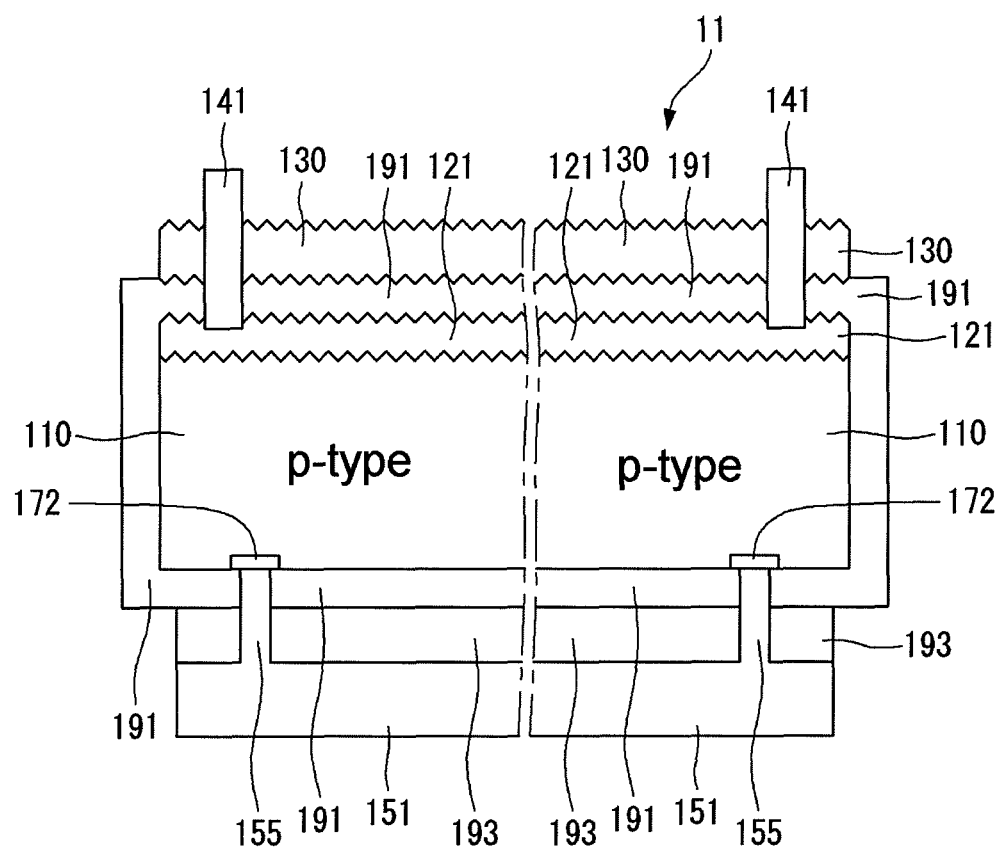
FIG. 3 is a schematic cross-sectional view entirely illustrating the solar cell shown in FIGS. 1 and 2.
Figure 4:
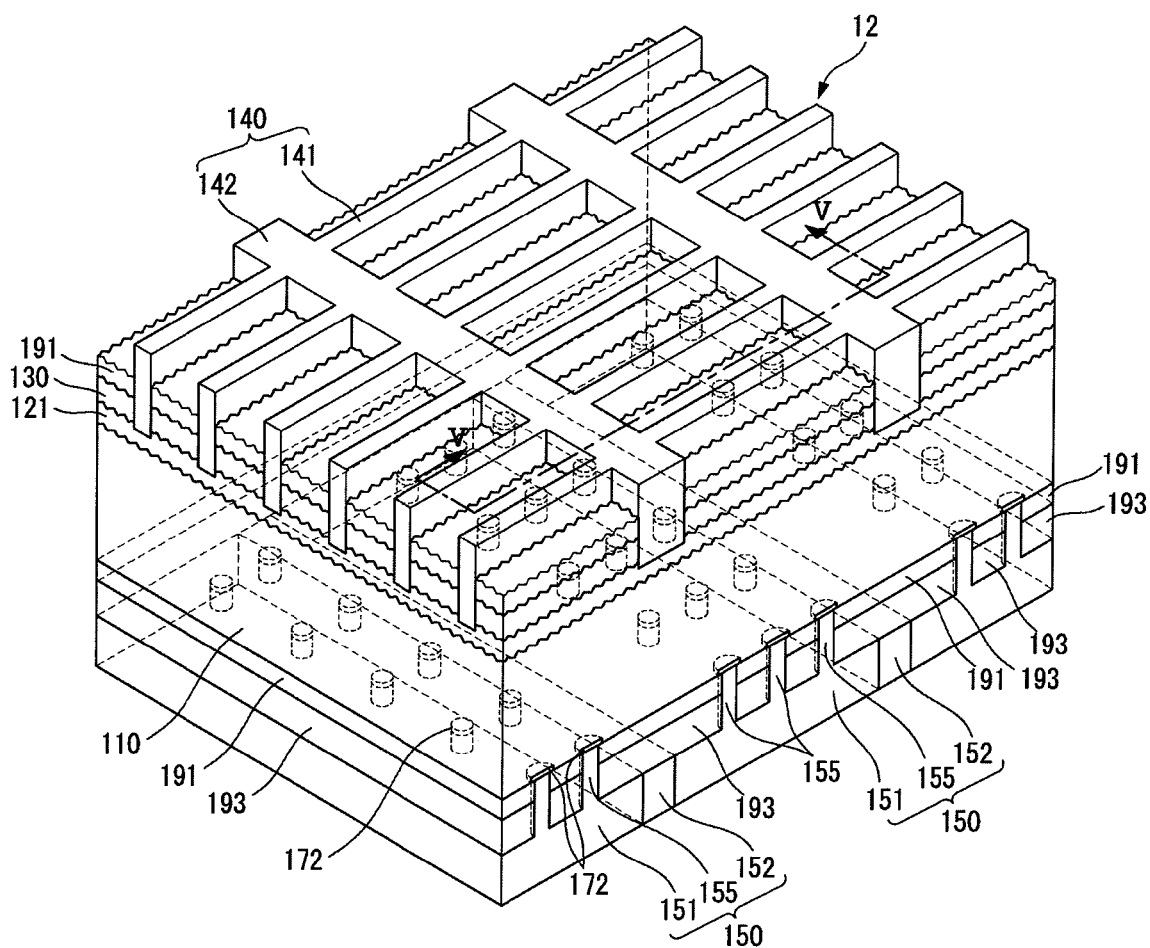
FIG. 4 is a partial perspective view of a solar cell according to another example embodiment of the invention.
Figure 5:
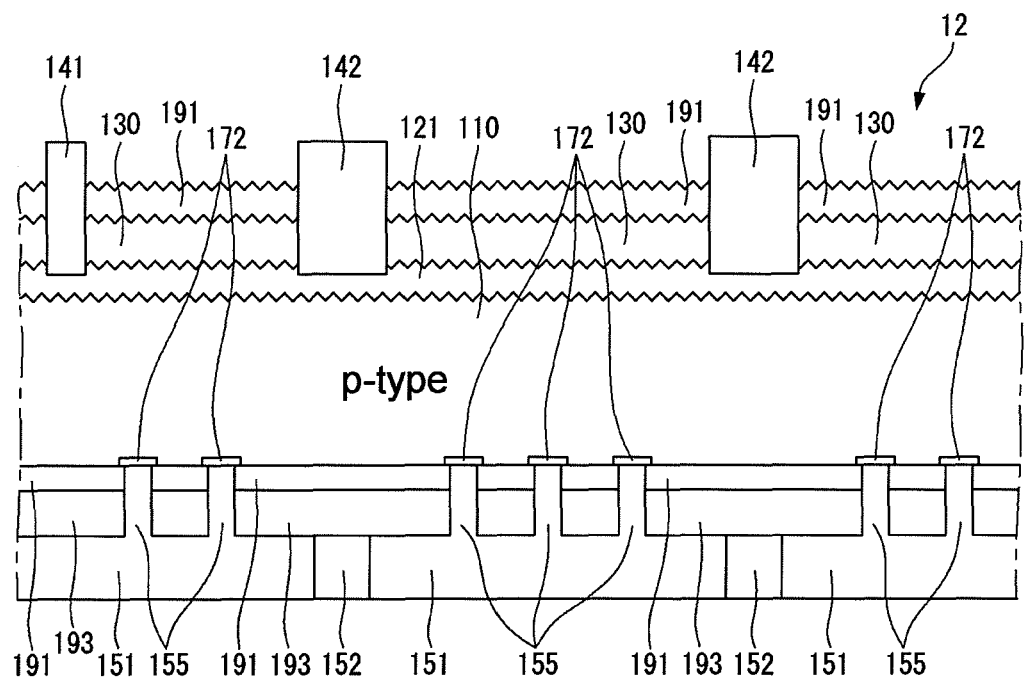
FIG. 5 is a cross-sectional view taken along line V-V of FIG. 4.
Figure 6:
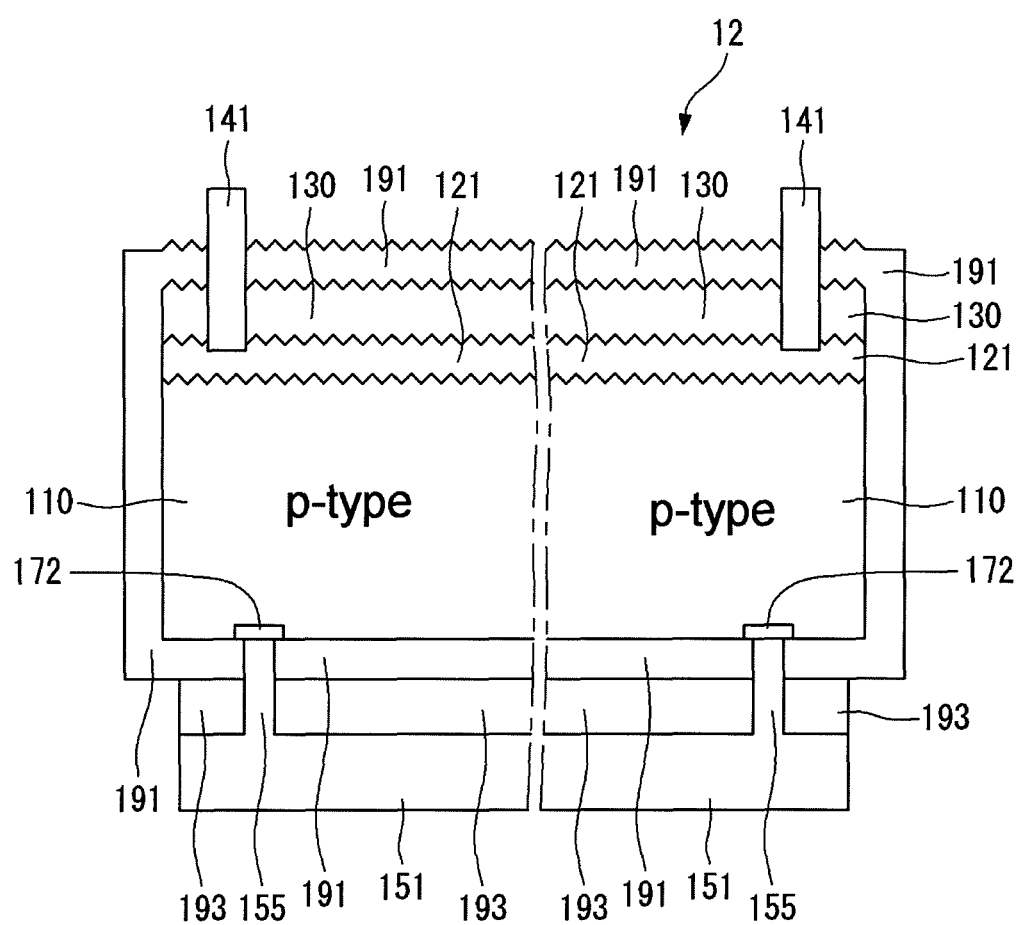
FIG. 6 is a schematic cross-sectional view entirely illustrating the solar cell shown in FIGS. 4 and 5.

The solar cell 12 shown in FIGS. 4 to 6 includes a passivation region 191 positioned on at least one of a front surface, a back surface, and a lateral surface of a substrate 110. Configuration of the solar cell 12 shown in FIGS. 4 to 6 is substantially the same as the solar cell 11 shown in FIGS. 1 to 3, except a formation location of the passivation region 191 and an anti-reflection layer 130 on the front surface of the substrate 110. Namely, the passivation region 191 and the anti-reflection layer 130 shown in FIGS. 4 to 6 are substantially the same as the passivation region 191 and the anti-reflection layer 130 shown in FIGS. 1 to 3 in a material, a thickness, a refractive index, etc.

In the solar cell 11 shown in FIGS. 1 to 3, the passivation region 191 is positioned directly on the emitter region 121 on the front surface of the substrate 110, and the anti-reflection layer 130 is positioned on the passivation region 191 on the front surface of the substrate 110.

On the other hand, in the solar cell 12 shown in FIGS. 4 to 6, the anti-reflection layer 130 is positioned directly on the emitter region 121 on the front surface of the substrate 110, and the passivation region 191 is positioned on the anti-reflection layer 130.

In this instance, after the emitter region 121 is formed on the front surface of the substrate 110, the passivation region 191 is formed on the anti-reflection layer, the back surface of the substrate 110, and the lateral surface of the substrate 110. As described above, the passivation region 191 is formed using various layer formation methods such as the PECVD method and the ALD method.

When the passivation region 191 is positioned on the anti-reflection layer 130 on the front surface of the substrate 110, a refractive index going, from air to the substrate 110 gradually increases because the anti-reflection layer 130 formed of silicon nitride has a refractive index of about 2.1. Namely, air (having a refractive index of about 1), the passivation region 191 (having a refractive index of about 1.6), the anti-reflection layer 130 (having a refractive index of about 2.1), and the substrate 110 (having a refractive index of about 3.1) are sequentially arranged in the order named and thus have gradually increasing refractive indexes.

Accordingly, a reduction effect of a reflectance of light incident from the outside (i.e., air) increases. Hence, an amount of light incident on the substrate 110 in the solar cell 12 shown in FIGS. 4 to 6 is more than the solar cell 11 shown in FIGS. 1 to 3. As a result, the efficiency of the solar cell 12 is further improved.

In the solar cell 12 shown in FIGS. 4 to 6, the passivation region 191 on the front surface of the substrate 110 serves as an anti-reflection part, and the anti-reflection layer 130 serves as a passivation part in the same manner as the solar cell 11 shown in FIGS. 1 to 3.

Since a method for manufacturing the solar cell 12 shown in FIGS. 4 to 6 is substantially the same as the method for manufacturing the solar cell 11 shown in FIGS. 1 to 3, except that before the passivation region 191 is formed, the anti-reflection layer 130 is formed on the emitter region 121 on the front surface of the substrate 110, a further description may be briefly made or may be entirely omitted.

Changes in a reflectance of light at the front surface (i.e., the incident surface) of the substrate 110 depending on changes in the thickness of the passivation region 191 is described below with reference to FIGS. 7 and 8.

Figure 7:
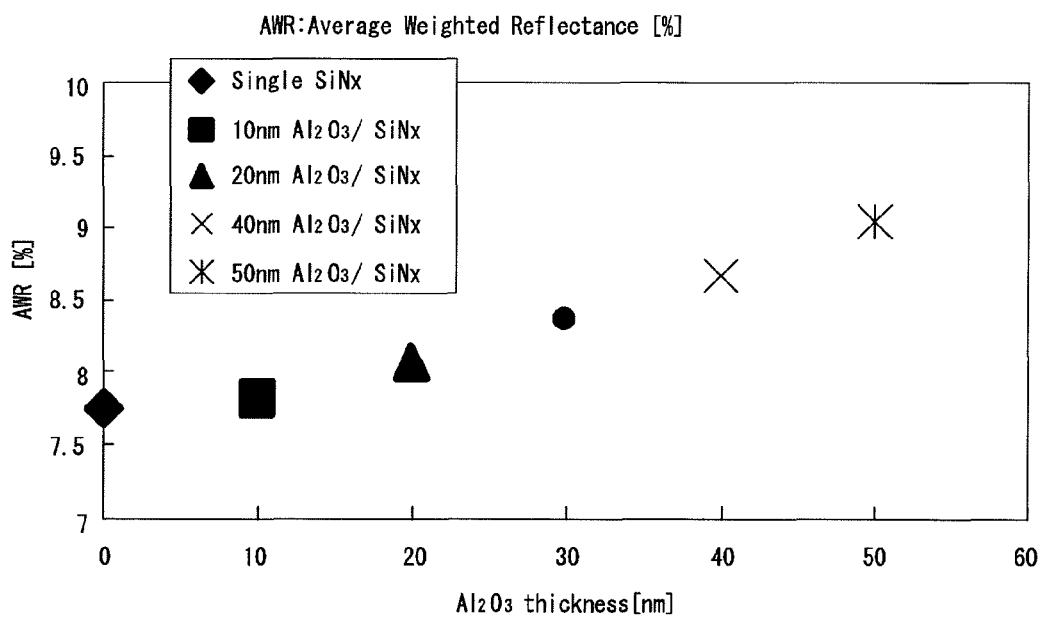
FIGS. 7 and 8 are graphs of a reflectance of light depending on changes in a thickness of a passivation region based on placement of the passivation region and an anti-reflection layer according to example embodiments of the invention.

More specifically, FIG. 7 illustrates a reflectance AWR of light depending on changes in the thickness of the passivation region 191 when the passivation region 191 formed of aluminum oxide (for example, $Al_2O_3$) is positioned on the emitter region 121 and the anti-reflection layer 130 formed of silicon nitride (SiNx) is positioned on the passivation region 191. Further, FIG. 8 illustrates a reflectance AWR of light depending on changes in the thickness of the passivation region 191 when the anti-reflection layer 130 formed of silicon nitride (SiNx) is positioned on the emitter region 121 and the passivation region 191 formed of aluminum oxide (for example, $Al_2O_3$) is positioned on the anti-reflection layer 130.

Figure 8:
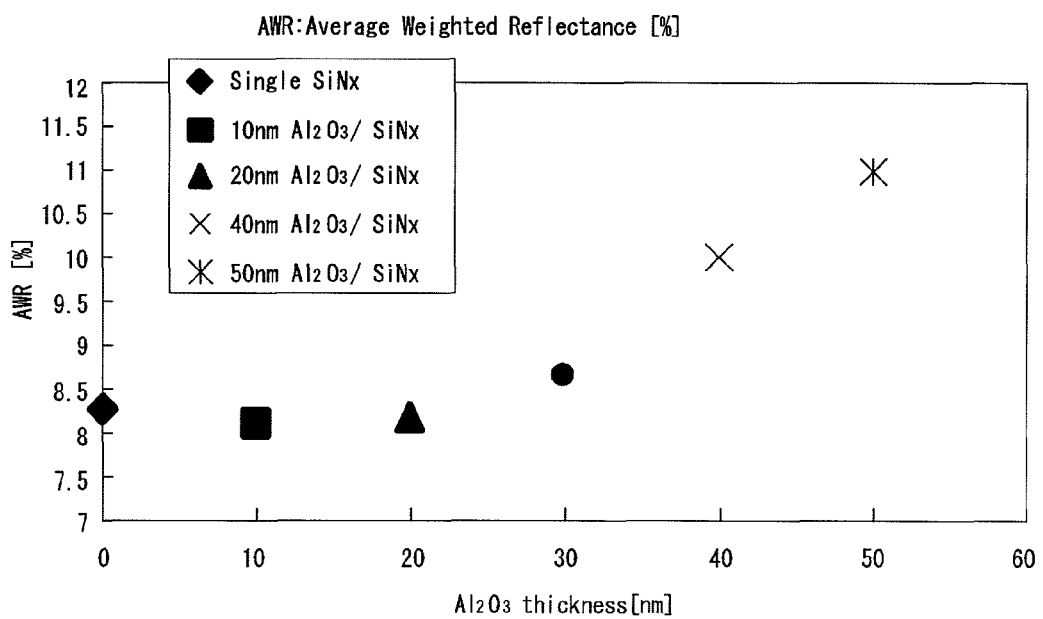

As shown in FIGS. 7 and 8, when the thickness of the passivation region 191 increased to about 30 nm and the anti-reflection layer 130 formed of silicon nitride had a single-layered structure, the reflectance AWR of light was similar to the reflectance AWR of light when the thickness of the passivation region 191 was substantially zero (i.e., when the passivation region 191 was omitted). Thus, when the thickness of the passivation region 191 was about 10 nm to 30 nm, additional effects including the above-described passivation effect and the effect of fixed charges was obtained without a large increase in the reflectance AWR of light. Hence, the efficiency of the solar cells 11 and 12 was greatly improved.

Figure 9:
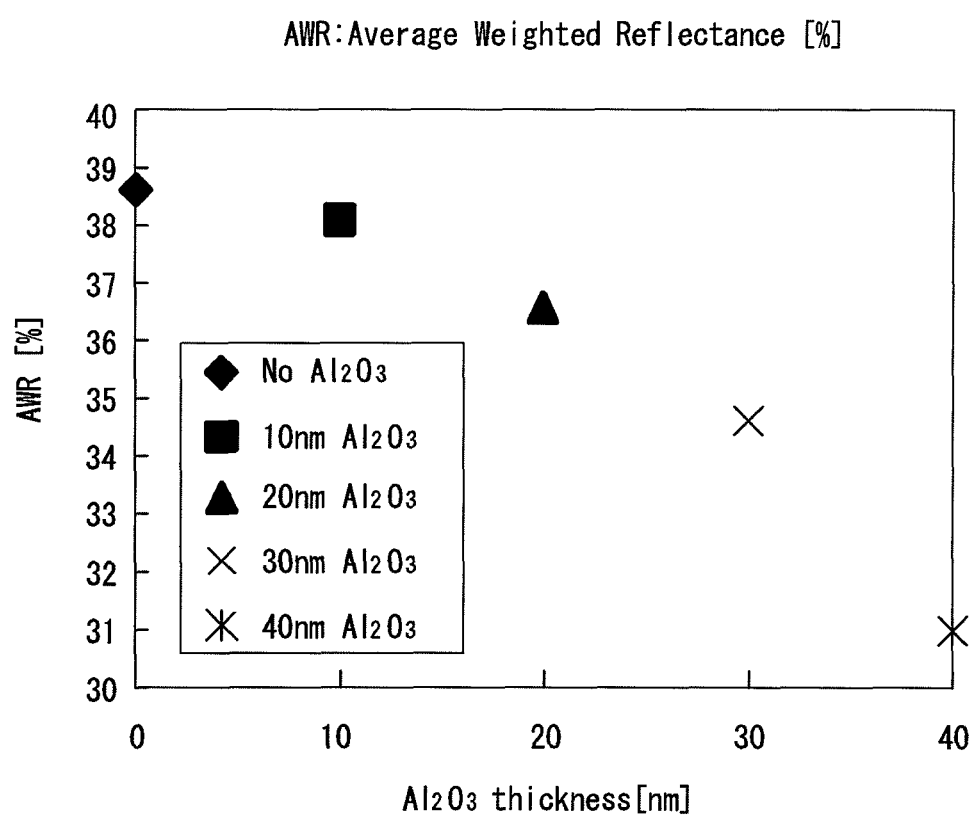
FIG. 9 is a graph indicating a reflectance of light incident on a lateral surface of a substrate depending on whether or not a passivation region is formed on a lateral surface of the substrate.

FIG. 9 is a graph indicating a reflectance AWR of light depending on whether or not the passivation region 191 is formed on the lateral surface of the substrate 110.

As shown in FIG. 9, when the passivation region 191 was not formed on the lateral surface of the substrate 110, the reflectance AWR of light was about 39%. On the other hand, when the passivation region 191 formed of aluminum oxide (for example, $Al_2O_3$) was formed on the lateral surface of the substrate 110, the reflectance AWR of light was less than about 39%. Namely, as the thickness of the passivation region 191 increased, the reflectance AWR of light decreased. Thus, when the passivation region 191 was formed on the lateral surface of the substrate 110 and the thickness of the passivation region 191 increased, an amount of light incident on the lateral surface of the substrate 110 increased.

As in the embodiment of the invention, when the passivation region 191 was formed on the lateral surface of the substrate 110, an amount of light incident on the solar cells 11 and 12 increased, and thus the efficiency of the solar cells 11 and 12 was improved.

In the embodiments of the invention, n-type impurities and p-type impurities are injected into a crystalline semiconductor substrate for a solar cell to form an n-type impurity region and a p-type impurity region in a portion of the crystalline semiconductor substrate. The n-type impurity region and the p-type impurity region serve as the emitter region 121 and the surface field region 172, respectively. A remaining semiconductor substrate excluding the n-type impurity region and the p-type impurity region from the crystalline semiconductor substrate serves as the substrate 110 according to the embodiments of the invention. The substrate 110, the emitter region 121, and the surface field region 172 are formed of the same crystalline semiconductor, and thus form a homojunction. Thus, the embodiments of the invention are described based on the solar cells 11 and 12 forming the homojunction using the substrate 110, the emitter region 121, and the surface field region 172.

Alternatively, the substrate 110 may be formed of a crystalline semiconductor, such as single crystal silicon or polycrystalline silicon, and the emitter region 121 and the surface field region 172 may be formed of an amorphous semiconductor, such as amorphous silicon, different from the crystalline semiconductor of the substrate 110. Thus, the substrate 110, the emitter region 121, and the surface field region 172 may form a heterojunction. The embodiments of the invention may be applied to a solar cell forming the heterojunction.

In the embodiments of the invention, the front electrode part 140 and the back electrode part 150 are positioned on the front surface and the back surface of the substrate 110, respectively. Alternatively, the embodiments of the invention may be applied to a solar cell, in which both the front electrode part 140 and the back electrode part 150 are positioned on the back surface of the substrate 110. In the following embodiments, structural elements having the same functions and structures as those discussed previously are designated by the same reference numerals, and a further description may be briefly made or may be entirely omitted.

Figure 10:
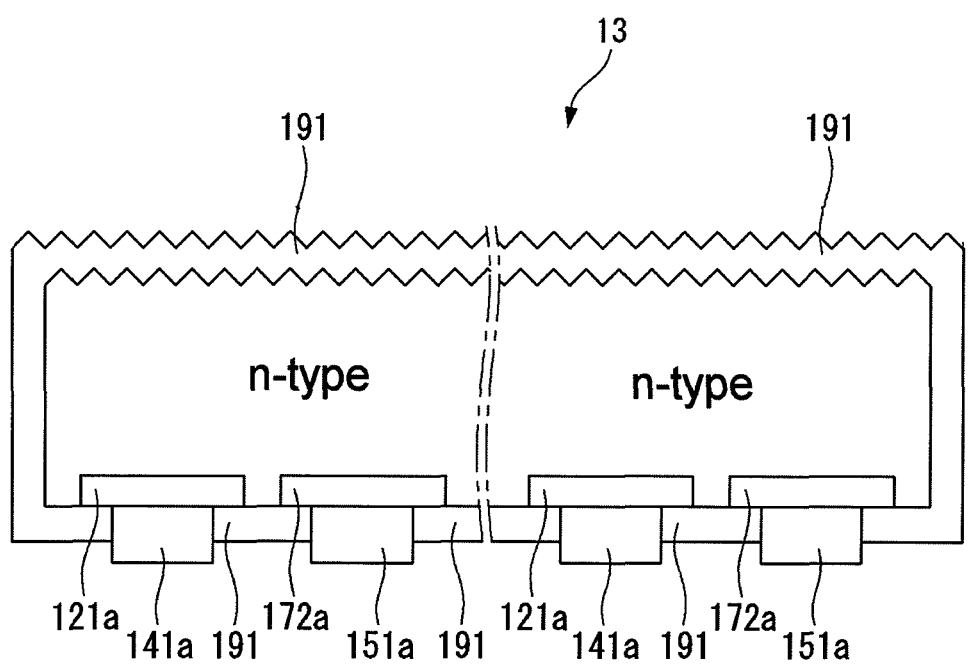
FIGS. 10 and 11 are schematic cross-sectional views entirely illustrating a solar cell according to another example embodiment of the invention.

As shown in FIG. 10, in a back contact solar cell 13 according to the embodiment of the invention, a plurality of emitter regions 121a and a plurality of surface field regions 172a are alternately positioned at a back surface of an n-type substrate 110 and extend parallel to one another in a fixed direction. A passivation region 191 formed of aluminum oxide is positioned on at least one of a front surface, the back surface, and a lateral surface of the substrate 110.

A plurality of first electrodes 141a are positioned on the plurality of emitter regions 121a, and a plurality of second electrodes 151a are positioned on the plurality of surface field regions 172a. A capping layer may be positioned on the passivation region 191 positioned on the back surface of the substrate 110, i.e., between the adjacent first and second electrodes 141a and 151a. A first bus bar connected to the plurality of first electrodes 141a and a second bus bar connected to the plurality of second electrodes 151a may be positioned on the back surface of the substrate 110.

The passivation region 191 positioned on the front surface of the substrate 110 performs a passivation function, but mainly performs an anti-reflection function as compared to the passivation function. Thus, the back contact solar cell 13 may further include an anti-reflection layer under the passivation region 191 positioned on the front surface of the substrate 110, so as to complement the anti-reflection function of the front surface of the substrate 110. In this instance, the anti-reflection layer may be formed of silicon oxide (SiOx) and/or silicon nitride (SiNx) and has positive fixed charges. In the back contact solar cell 13 according to the embodiment of the invention, because the n-type substrate 110 is used, minority carriers (i.e., holes) of the substrate 110 easily move to the back surface of the substrate 110 instead of the front surface of the substrate 110 by the anti-reflection layer having the positive fixed charges. Hence, the holes of the substrate 110 more smoothly move to the plurality of emitter regions 121a.

A method for manufacturing the back, contact solar cell 13 shown in FIG. 10 is described below. The plurality of emitter regions 121a and the plurality of surface field regions 172a are formed in the back surface of the substrate 110 using the thermal diffusion method or the ion implantation method. The passivation region 191 is formed on at least one of the front surface, the lateral surface, and the back surface (i.e., on the emitter regions 121a and the surface field regions 172a) of the substrate 110 through the process discussed previously.

Next, the plurality of first electrodes 141a connected to the plurality of emitter regions 121a and the plurality of second electrodes 151a connected to the plurality of surface field regions 172a are formed using a through operation of the passivation region 191 or an etching paste through the above-described thermal process.

The embodiments of the invention may be applied to a bifacial solar cell, in which light is incident on both the front surface and the back surface of the substrate 110.

Figure 11:
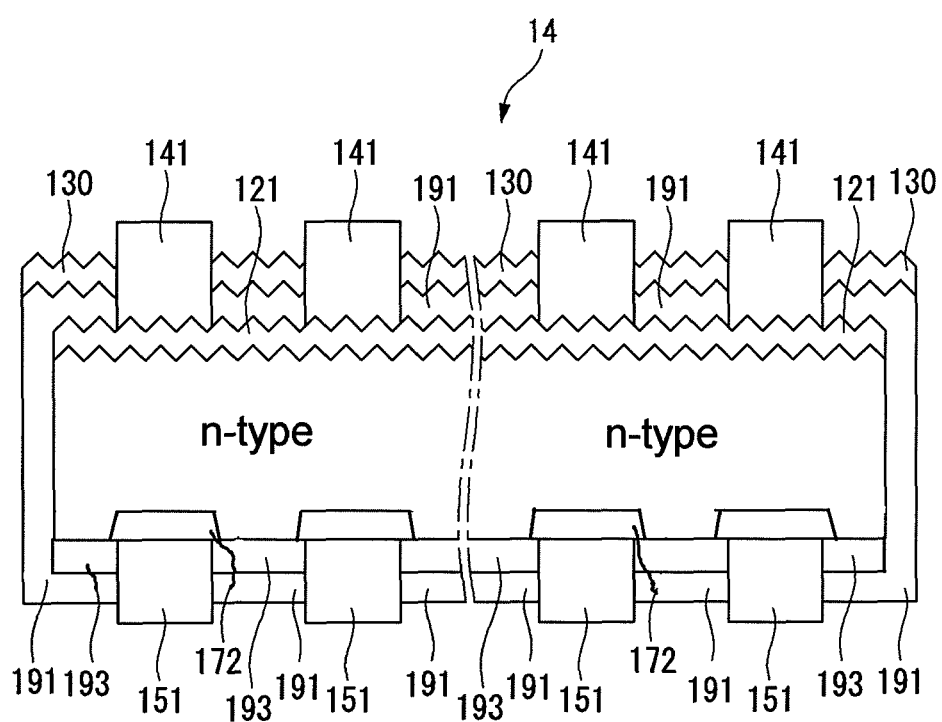

For example, as shown in FIG. 11, in a solar cell 14 according to the embodiment of the invention, an emitter region 121 is positioned on a front surface of an n-type substrate 110, a plurality of surface field regions 172 are positioned on a back surface of the substrate 110, and a capping layer 193 is positioned directly on the back surface of the substrate 110. A passivation region 191 formed of aluminum oxide is positioned on at least one of a front surface (i.e., directly on the emitter region 121), a back surface (i.e., directly on the capping layer 193), and a lateral surface of the substrate 110. An anti-reflection layer 130 is positioned on the passivation region 191 on the front surface of the substrate 110. A plurality of front electrodes 141 are positioned on the front surface of the substrate 110 and are connected to the emitter region 121. A plurality of back electrodes 151 are positioned directly on the back surface (i.e., on the plurality of surface field regions 172) of the substrate 110 and are connected to the plurality of surface field regions 172. Because the plurality of back electrodes 151 are respectively positioned on the plurality of surface field regions 172, the back electrodes 151 are separated from one another. Further, the surface field regions 172 are not positioned at the back surface of the substrate 110 between the adjacent back electrodes 151. A front bus bar connected to the plurality of front electrodes 141 may be positioned on the front surface of the substrate 110, and a back bus bar connected to the plurality of back electrodes 151 may be positioned on the back surface of the substrate 110. Hence, the plurality of front electrodes 141 may be connected to one another using the front bus bar, and the plurality of back electrodes 151 may be connected to one another using the back bus bar. A surface field region may be additionally positioned at the back surface of the substrate 110 on which the back bus bar is positioned. In this instance, the plurality of surface field regions 172 may be connected to the surface field region positioned under the back bus bar.

Because the capping layer 193 having positive fixed charges is positioned directly on the back surface of the substrate 110, the capping layer 193 performs a passivation function and makes it easier for electrons to move from the n-type substrate 110 to the back surface of the n-type substrate 110. Hence, an amount of electrons transferred from the substrate 110 to the plurality of back electrodes 151 increases.

Configuration and function of the emitter region 121a (121) and/or the surface field region 172a (172) and the first and second electrodes 141a (141) and 151a (151) connected to the regions 121a (121) and 172a (172) in the solar cells 13 and 14 shown in FIGS. 10 and 11 are substantially the same as those in the solar cells 11 and 12 shown in FIGS. 1 to 6, except their location. Therefore, a further description may be briefly made or may be entirely omitted.

A method for manufacturing the solar cell 14 shown in FIG. 11 is substantially the same as the manufacturing method described with reference to FIGS. 1 to 3, except a coating location (or a coating shape) of a back electrode pattern for the back electrodes 151. Therefore, a further description may be briefly made or may be entirely omitted.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a substrate of a first conductive type;
an emitter region of a second conductive type opposite the first conductive type, the emitter region being positioned at the substrate;
a first electrode which is positioned on the substrate and is connected to the emitter region;
at least one second electrode which is positioned on the substrate and is connected to the substrate;
an aluminum oxide layer having negative fixed charges and positioned on both a front surface and a back surface of the substrate excluding areas of the substrate on which the first electrode and the at least one second electrode are formed; and
an anti-reflection layer formed of silicon nitride having positive fixed charges and positioned on the aluminum oxide layer on the front surface of the substrate,
wherein the aluminum oxide layer on the front surface of the substrate and the aluminum oxide layer on the back surface of the substrate have the same thickness, the same refractive index, the same material, and the same composition,
a thickness of the anti-reflection layer formed of silicon nitride is greater than a thickness of the aluminum oxide layer on the front surface of the substrate, and
a refractive index of the anti-reflection layer formed of silicon nitride is greater than a refractive index of the aluminum oxide layer on the front surface of the substrate.

2. The solar cell of claim 1, wherein the aluminum oxide layer is additionally positioned on a lateral surface of the substrate which intersects the front surface and a back surface of the substrate.

3. The solar cell of claim 2, wherein the aluminum oxide layer on the front surface of the substrate, the aluminum oxide layer on the back surface of the substrate, and the aluminum oxide layer on the lateral surface of the substrate have the same thickness, the same refractive index, the same material, and the same composition.

4. The solar cell of claim 1, wherein the first conductive type of the substrate is a p-type.

5. The solar cell of claim 1, further comprising a capping layer positioned between the aluminum oxide layer on the back surface of the substrate and the at least one second electrode.

6. The solar cell of claim 5, wherein the capping layer is formed of silicon nitride or silicon oxide.

7. The solar cell of claim 6, further comprising a plurality of surface field regions which are locally positioned at the back surface of the substrate and are separated from one another,
wherein the at least one second electrode is one second electrode including a plurality of contact portions abutting the plurality of surface field regions, and
wherein the one second electrode is connected to the substrate through the plurality of contact portions.

8. The solar cell of claim 7, wherein the aluminum oxide layer has a thickness of about 10 nm to 30 nm.

9. The solar cell of claim 7, wherein the first electrode is positioned on the front surface of the substrate, and the one second electrode is positioned on the back surface of the substrate.

10. The solar cell of claim 1, further comprising a capping layer positioned between the aluminum oxide layer on the back surface of the substrate and the at least one second electrode.

11. The solar cell of claim 10, wherein the capping layer is formed of silicon nitride or silicon oxide.

12. The solar cell of claim 11, wherein when the capping layer is formed of silicon nitride, the capping layer has a thickness of about 50 nm to 100 nm.

13. The solar cell of claim 11, wherein when the capping layer is formed of silicon oxide, the capping layer has a thickness of about 70 nm to 150 nm.

14. The solar cell of claim 1, further comprising a plurality of surface field regions which are locally positioned at the back surface of the substrate and are separated from one another,
wherein the at least one second electrode includes a plurality of contact portions abutting the plurality of surface field regions, and
wherein the at least one second electrode is connected to the substrate through the plurality of contact portions.

15. The solar cell of claim 1, further comprising a plurality of surface field regions locally positioned at the back surface of the substrate,
- wherein the first conductive type of the substrate is an n-type, and
- wherein the at least one second electrode is a plurality of second electrodes positioned on the plurality of surface field regions.

16. The solar cell of claim 15, wherein the first electrode is positioned on the front surface of the substrate, and the plurality of second electrodes are positioned on the back surface of the substrate, and
- wherein both the front surface and the back surface of the substrate are incident surfaces on which light is incident.

17. The solar cell of claim 1, wherein the refractive index of the anti-reflection layer formed of silicon nitride is 2.0-2.2 and the refractive index of the aluminum oxide layer on the front surface of the substrate is 1.4-1.6.

\* \* \* \* \*